US010297450B2

(12) United States Patent
Fujii et al.

(10) Patent No.: US 10,297,450 B2
(45) Date of Patent: May 21, 2019

(54) MANUFACTURING METHOD OF SIC SUBSTRATE

(71) Applicant: FUJI ELECTRIC CO., LTD., Kanagawa (JP)

(72) Inventors: Takeshi Fujii, Hino (JP); Mariko Sato, Fujisawa (JP); Takuro Inamoto, Kawasaki (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/709,411

(22) Filed: Sep. 19, 2017

(65) Prior Publication Data

US 2018/0005828 A1 Jan. 4, 2018

Related U.S. Application Data

(63) Continuation of application No. PCT/JP2015/071723, filed on Jul. 30, 2015.

(51) Int. Cl.

| | |
|---|---|
| ***H01L 21/04*** | (2006.01) |
| ***H01L 29/04*** | (2006.01) |
| ***H01L 29/16*** | (2006.01) |
| ***H01L 21/268*** | (2006.01) |
| ***H01L 21/324*** | (2006.01) |
| ***H01L 21/3065*** | (2006.01) |
| *C30B 33/02* | (2006.01) |
| *C30B 33/12* | (2006.01) |

(52) U.S. Cl.

CPC ........ *H01L 21/0475* (2013.01); *H01L 21/268* (2013.01); *H01L 21/3065* (2013.01); *H01L 21/324* (2013.01); *H01L 29/045* (2013.01); *H01L 29/1608* (2013.01); *C30B 33/02* (2013.01); *C30B 33/12* (2013.01)

(58) Field of Classification Search

CPC ............... H01L 21/0475; H01L 29/045; H01L 21/3065; H01L 21/268; H01L 29/1608; H01L 21/324; C30B 33/12; C30B 33/02

See application file for complete search history.

(56) References Cited

U.S. PATENT DOCUMENTS 6,995,396 B2 * 2/2006 Takahashi ............... C30B 25/02 257/77
2003/0080384 A1 5/2003 Takahashi et al.
2013/0217213 A1 8/2013 Aigo et al.

FOREIGN PATENT DOCUMENTS

JP 2003-234301 A 8/2003
JP 2005-317670 A 11/2005
(Continued)

OTHER PUBLICATIONS

Hiroshi Nakagawa et al., "Self-Ordering of Nanofacets on Vicinal SiC Surfaces", Nov. 26, 2003, Phisical Review Letters 91, 226107.
(Continued)

*Primary Examiner* — Anita K Alanko

(57) ABSTRACT

Provided is a manufacturing method for manufacturing a SiC substrate having a flattened surface, including etching the surface of the SiC substrate by irradiating the surface of the SiC substrate with atomic hydrogen while the SiC substrate having an off angle is heated. In the etching, the SiC substrate may be heated within a range of 800° C. or higher and 1200° C. or lower.

9 Claims, 3 Drawing Sheets

100
30
20
22
18
10
16
ATOMIC HYDROGEN
200
12
LASER LIGHT
15
14

(56) References Cited

FOREIGN PATENT DOCUMENTS

| | | | |
|---|---|---|---|
| JP | 2008205296 | A | 9/2008 |
| WO | 2012/067112 | A1 | 5/2012 |

OTHER PUBLICATIONS

International Search Report for International Patent Application No. PCT/JP2015/071723, issued by the Japan Patent Office dated Sep. 1, 2015.

Office Action issued for counterpart Japanese Application 2017-530979, issued by the Japan Patent Office dated Aug. 21, 2018.

* cited by examiner

MANUFACTURING METHOD OF SiC SUBSTRATE

The contents of the following Japanese patent application are incorporated herein by reference:

NO. PCT/JP2015/071723 filed on Jul. 30, 2015.

BACKGROUND

1. Technical Field

The present invention relates to a manufacturing method of a SiC substrate.

2. Related Art

SiC has gotten much attention as material of MOS transistors for power devices in which both of maintenance of breakdown voltage and miniaturization are achieved because SiC has about 10 times greater dielectric breakdown strength than Si and GaAs, and high thermal conductivity. The larger a channel resistance is, the larger energy loss of a MOS transistor during operation becomes. The channel resistance highly depends on a state of an interface between a SiC substrate and an oxide film, that is, flatness of a surface of the SiC substrate. The following is a document in which prior art for flattening a surface of a SiC substrate is disclosed.

Non-Patent Document 1: Hiroshi Nakagawa, Satoru Tanaka, and Ikuo Suemue, "Self-Ordering of Nanofacets on Vicinal SiC Surfaces", Nov. 26, 2003, PHISICAL REVIEW LETTERS 91, 226107.

In the foregoing prior art, a substrate surface of a SiC substrate is etched with hydrogen by annealing the SiC substrate at about 1400° C. in a hydrogen atmosphere to flatten the surface of the SiC substrate. However, the annealing conditions are considerably limited.

SUMMARY

According to a first aspect of the present invention, provided is a manufacturing method for manufacturing a SiC substrate having a flattened surface including etching the surface of the SiC substrate by irradiating the surface of the SiC substrate with atomic hydrogen while the SiC substrate having an off angle is heated.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the claims. Also, all the combinations of the features described in the embodiments are not necessarily essential for means for solving the problem of the invention.

Figure 1:
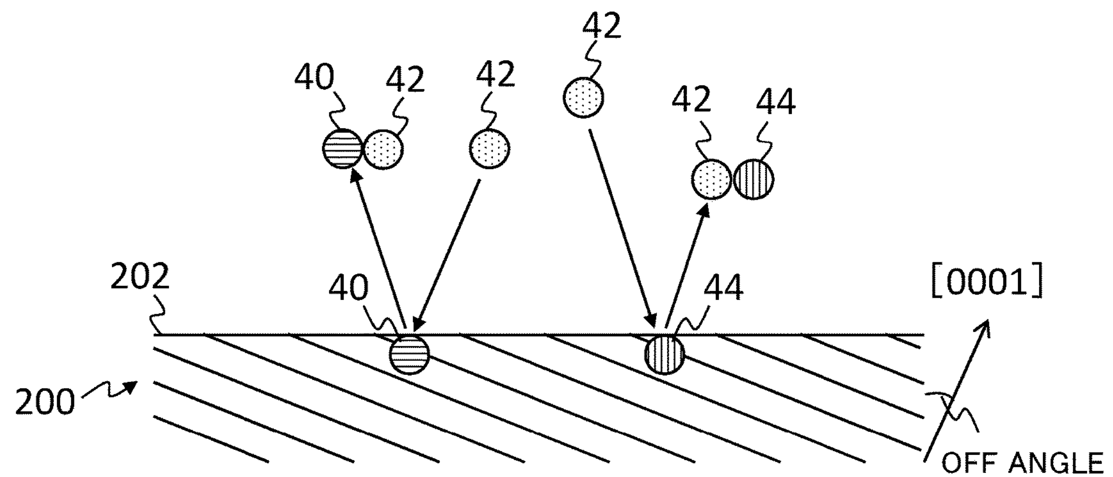
FIG. 1 shows a diagram illustrating an outline of a manufacturing method for manufacturing a SiC substrate 200 having a flattened surface.

FIG. 1 shows a diagram illustrating an outline of a manufacturing method for manufacturing a SiC substrate 200 having a flattened surface. FIG. 1 shows a partial cross section near a surface 202 of the SiC substrate 200. The SiC substrate 200 having an off angle is prepared first. The SiC substrate 200 having an off angle is prepared by measuring, by for example, a goniometer or the like, a crystal plane of a plane where a device should be formed and cutting a surface of the substrate with the surface being inclined at a predetermined angle in the direction of a crystal axis.

When the SiC substrate 200 has an off angle, a SiC thin film which is grown on the surface of the SiC substrate 200 can be made to be of high quality. In the example of FIG. 1, the surface 202 of the SiC substrate 200 has a predetermined off angle with respect to (0001) plane which is a stable plane. For example, the off angle is 1° or more and 8° or less. The off angle may be 4° or more and 8° or less.

Then, the surface of the SiC substrate 200 is flattened by polishing through the CMP method. Thereby, the surface 202 of the SiC substrate 200 becomes mirror-finished. However, when the SiC substrate 200 having an off angle is heated to a high temperature of about 1400° C., a phenomenon called bunching occurs. Bunching is a phenomenon that the substrate surface undesirably becomes saw-toothed at intervals of about several micrometers (μm) and with the height of about tens of nanometers (nm). This is caused by reconstruction of the surface of the substrate to be more stable due to the presence of the off angle. The surface with such large undulations cannot be used to form a device at all.

In the manufacturing method of the present example, the SiC substrate 200 having an off angle is heated in a vacuum first. The surface 202 of the SiC substrate 200 has been polished through the CMP method or the like. The heating temperature is within a range of for example, 800° C. or higher and 1200° C. or lower. The heating temperature is lower than the temperature at which the bunching phenomenon occurs on the SiC substrate 200. It is more preferable that the heating temperature is 900° C. or higher and 1100° C. or lower. Various methods such as heaters, electric heating, electron beam heating, infrared heating, laser heating may be used as a heating method.

Then, the surface 202 of the SiC substrate 200 is etched by irradiating the surface 202 of the SiC substrate 200 with atomic hydrogen 42 while the SiC substrate 200 is heated. Atomic hydrogen is hydrogen that exists as a monoatom, and is highly reactive. The irradiation with the atomic hydrogen 42 refers to supply of the atomic hydrogen 42 which is generated at a position away from the SiC substrate 200 to the surface 202 of the SiC substrate 200. Thus, the manufacturing method of the present example does not include the method of etching the surface of the SiC substrate using atomic hydrogen dissociated from hydrogen gas near the surface by heat of the SiC substrate as the technique disclosed in Non-Patent Document 1.

As shown in FIG. 1, when the atomic hydrogen 42 touches the surface 202 of the SiC substrate 200, it reacts with silicon atoms 40 at the surface 202 to turn to silane-based gas. Thereby, the silicon atoms 40 are desorbed from the surface 202 of the SiC substrate 200. Furthermore, the atomic hydrogen 42 reacts with carbon atoms 44 at the surface 202 of the SiC substrate 200 to turn to hydrocarbon-based gas. Thereby, the carbon atoms 44 are desorbed from the surface 202 of the SiC substrate 200.

Figure 2:
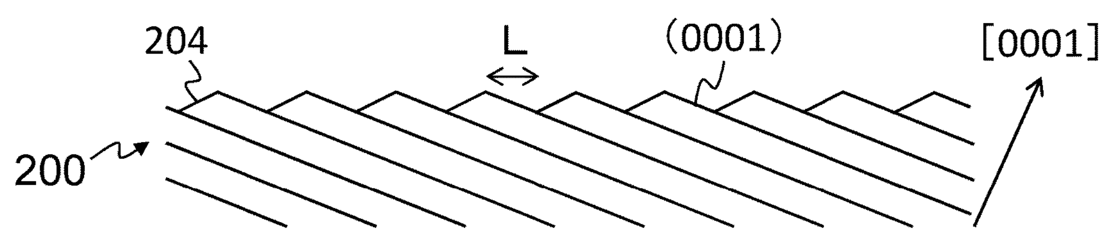
FIG. 2 shows the SiC substrate 200 after etching.

FIG. 2 shows the SiC substrate 200 after etching. The SiC substrate 200 is etched so that terraces of (0001) planes which are stable planes are exposed at regular intervals. (11-2 n) planes are exposed between the respective terraces. A width of the terrace L differs according to an off angle and an off direction, and is generally from about 10 nm to 20 nm. The terraces of the (0001) planes and the (11-2 n) planes appear alternately. As a result, nanofacets are formed on the surface 204 of the SiC substrate 200.

The surface 204 on which nanofacets have been formed has flatness similar to a step and terrace structure of the SiC substrate 200 which does not have an off angle. For this reason, the surface 204 may be regarded as an ideal surface for the SiC substrate 200 having an off angle.

Once the nanofacets are formed on the surface 204 of the SiC substrate 200, their shapes are maintained. Even if etching is further promoted, the shapes of the nanofacets are maintained while thickness of the film of the SiC substrate 200 is reduced.

In this way, the nanofacets can be formed on the surface of the SiC substrate 200 by irradiating the surface of the SiC substrate 200 with atomic hydrogen. In addition, the temperature of the SiC substrate 200 can be set to a low temperature and can be set relatively freely because the heat of the SiC substrate 200 is not used for generation of atomic hydrogen. The temperature of the SiC substrate 200 can be set lower than the temperature at which bunching occurs on the surface. Furthermore, the temperature of the SiC substrate 200 may be a temperature at which reaction of the atomic hydrogen 42 with silicon atoms and carbon atoms can be facilitated.

In contrast, when atomic hydrogen is dissociated from hydrogen gas at the temperature of the SiC substrate 200, the temperature of the SiC substrate 200 has to be raised to a degree at which atomic hydrogen can be generated. Because dissociation efficiency of the atomic hydrogen is improved as the temperature of the SiC substrate 200 is raised, etching efficiency is improved.

Meanwhile, when the SiC substrate 200 is heated to a high temperature, bunching easily occurs because reconstruction of the substrate surface becomes active. In addition, desorption of Si from the surface of the SiC substrate 200 is facilitated. For this reason, flatness of the surface is degraded as the SiC substrate 200 is heated to a higher temperature.

In this way, when the atomic hydrogen is dissociated from the hydrogen gas at the temperature of the SiC substrate 200, generation of atomic hydrogen and reconstruction of the surface cannot be controlled independently. This limits considerably the temperature conditions under which the nanofacets can be formed on the surface of the SiC substrate 200 by appropriately balancing the dissociation of atomic hydrogen and the reconstruction of the substrate surface. Furthermore, because the temperature conditions are significantly affected by misalignment of the off angle and the off direction of the SiC substrate 200, it takes much time to determine the conditions.

As described above, according to the manufacturing method shown in FIGS. 1 and 2, the temperature of the SiC substrate 200 and the generation of atomic hydrogen can be made independent of each other. In other words, the etching efficiency and the generation of atomic hydrogen can be controlled independently. Therefore, the temperature of the SiC substrate 200 can be set to a low temperature, and also the temperature conditions can be easily set. Furthermore, even if slight misalignment of the off angle and the off direction occurs, the nanofacets can be formed stably with high reproducibility.

In addition, the nanofacets can be easily formed on the SiC substrate 200 with high reproducibility. Therefore, the yield of devices using the SiC substrate 200 can be improved, and also the characteristics of the devices can be improved.

Figure 3:
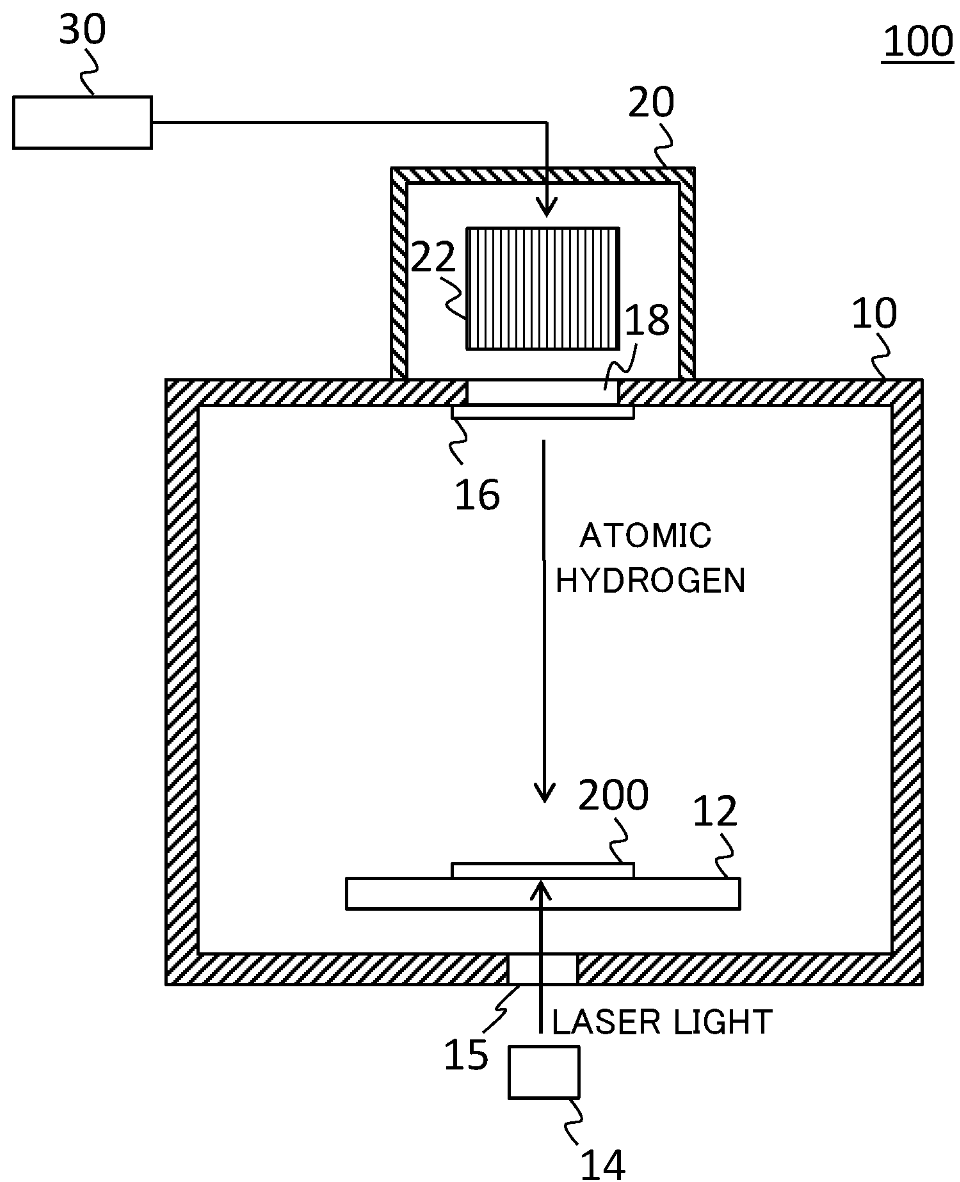
FIG. 3 shows a diagram illustrating an outline of a processing device 100 for processing the SiC substrate 200.

FIG. 3 shows a diagram illustrating an outline of a processing device 100 for processing the SiC substrate 200. The processing device 100 flattens the surface of the SiC substrate 200 by irradiating the surface of the SiC substrate 200 with atomic hydrogen. The processing device 100 includes a processing chamber 10, a gas supply cell 20 and a hydrogen gas source 30.

The SiC substrate 200 to be processed is led into the processing chamber 10. The processing chamber 10 has a stage 12 on which the SiC substrate 200 is placed. After the SiC substrate 200 is led into the processing chamber 10, the inside of the processing chamber 10 is decompressed to vacuum. Furthermore, a heating unit 14 which heats the SiC substrate 200 is provided in the processing device 100. The heating unit 14 of the present example heats the SiC substrate 200 by irradiating the SiC substrate 200 with laser light through a window portion 15 provided in the processing chamber 10.

The gas supply cell 20 is coupled to the processing chamber 10. A coupling hole 18 which couples the inside of the gas supply cell 20 to the inside of the processing chamber 10 is formed in a sidewall of the processing chamber 10 of the present example. A shutter 16 which opens and closes the coupling hole 18 is provided on at least one of the processing chamber 10 and the gas supply cell 20.

The gas supply cell 20 of the present example has a tungsten filament 22. Furthermore, the hydrogen gas source 30 supplies hydrogen gas including molecular hydrogen to the inside of the gas supply cell 20. When the tungsten filament 22 is heated to about for example, 1700° C., the molecular hydrogen is dissociated from and adsorbed into the surface of the tungsten filament 22 and atomic hydrogen is generated. Alternatively, the processing device 100 may generate atomic hydrogen with plasma or the like. In this case, plasma may be generated inside the processing chamber 10 to generate atomic hydrogen.

The SiC substrate 200 while being heated is irradiated with the atomic hydrogen generated in the gas supply cell 20 by opening the shutter 16. Note that bringing the inside of the processing chamber 10 into a vacuum state can prevent the atomic hydrogen from reacting with other substances and supply hydrogen as the atomic hydrogen to the SiC substrate 200.

EXAMPLE

Table 1 shows manufacturing conditions for each example and each comparative example in which the surface of the SiC substrate 200 is processed, and results as to whether the nanofacets are formed on the substrate surface. Each example is a sample made using the method described in FIGS. 1 to 3. Materials, used amounts of the materials or the like, percentages of the materials or the like, processing content, processing procedure, elements, orientations of crystal planes or the like, etc. in each example can be changed as appropriate to the extent not departing from the spirit of the present invention. Thus, the scope of the present invention is not limited to the following examples.

TABLE 1

| | temperature | substrate | | formation of nanofacets |
|---|---|---|---|---|
| Example 1 | 800° C. | 4H—SiC(0001) | 4° off[11-20] direction | ○ |
| Example 2 | 1200° C. | 4H—SiC(0001) | 4° off[11-20] direction | ○ |
| Example 3 | 1200° C. | 4H—SiC(0001) | 8° off[11-20] direction | ○ |
| Example 4 | 1200° C. | 4H—SiC(0001) | 4° off[1-100] direction | ○ |
| Example 5 | 1200° C. | 6H—SiC(0001) | 4° off[11-20] direction | ○ |
| Example 6 | 1200° C. | 4H—SiC(000-1) | 4° off[11-20] direction | ○ |
| Comparative Example 1 | 400° C. | 4H—SiC(0001) | 4° off[11-20] direction | x |
| Comparative Example 2 | 1300° C. | 4H—SiC(0001) | 4° off[11-20] direction | x |

In the Example 1, an -n-type SiC (0001) wafer having the off angle of 4°, the off direction of [11-20], the thickness of 430 μm and the diameter of 3 inches was prepared. The CMP processing has been performed on the surface of the wafer. A 10 μm n-type epitaxial layer the carrier concentration of which is $10^{19}$ $cm^{-3}$ was formed on the wafer through CVD.

After dicing the wafer into squares with a side of 10 mm, organic cleaning process was performed and $UVO_3$ process was performed at 300° C. for 10 minutes to form the SiC substrate. The SiC substrate was led into the processing chamber 10, and the insides of the processing chamber 10 and the gas supply cell 20 were drawn to a vacuum of $2.0\times10^{-7}$ Pa. Then, the SiC substrate was irradiated with the laser light and SiC substrate was the heated. The rate of temperature rise was 20° C./min, and after reaching 800° C., the temperature was maintained for 10 minutes.

Then, the shutter 16 was closed, and the tungsten filament 22 in the gas supply cell 20 was heated to 1700° C. Hydrogen gas was supplied until a degree of vacuum within the gas supply cell 20 reached $1.0\times10^{-4}$ Pa, with the tungsten filament 22 heated. The hydrogen gas is dissociated from and adsorbed into the surface of the tungsten filament 22 to turn to atomic hydrogen. A dissociation rate is about several percent.

Then, the shutter 16 was opened, and the SiC substrate was irradiated with the atomic hydrogen for 10 minutes. The amount of gas irradiation onto the SiC substrate is about several ccm. The irradiation time and the irradiation amount of atomic hydrogen can be changed as appropriate. The irradiation time may be about 10 minutes or longer and one hour or shorter.

After the irradiation with atomic hydrogen ended, the shutter 16 was closed, and the temperature of the SiC substrate was decreased to a room temperature to end the processing. The processed SiC substrate was taken out into the atmosphere, and the substrate surface was observed with an atomic force microscope to check whether nanofacets were formed. As shown in Table 1, the nanofacets have been formed under the condition of Example 1.

In Example 2, the SiC substrate was made under the same condition as for Example 1 except that the heating temperature of the SiC substrate was set to 1200° C. The nanofacets have been formed under the condition of Example 2 as well.

In Example 3, the SiC substrate was made under the same condition as for Example 2 except that the off angle of the SiC substrate was set to 8°. The nanofacets have been formed under the condition of Example 3 as well.

In Example 4, the SiC substrate was made under the same condition as for Example 2 except that the off direction of the SiC substrate was set to [1-100]. The nanofacets have been formed under the condition of Example 4 as well.

In Example 5, the SiC substrate was made under the same condition as for Example 2 except that a polymorph of the SiC substrate was set to 6H. The nanofacets have been formed under the condition of Example 5 as well.

In Example 6, the SiC substrate was made under the same condition as for Example 2 except that the crystal plane of the SiC substrate was set to (000-1). The nanofacets have been formed under the condition of Example 6 as well.

In Comparative Example 1, the SiC substrate was made under the same condition as for Example 1 except that the heating temperature of the SiC substrate was set to 400° C. The nanofacets have not been formed under the condition of Comparative Example 1. Under the condition of Comparative Example 1, the surface of the SiC substrate is in a state similar to a state before the processing.

In Comparative Example 2, the SiC substrate was made under the same condition as for Example 1 except that the heating temperature of the SiC substrate was set to 1300° C. The nanofacets have not been formed under the condition of Comparative Example 2. Under the condition of Comparative Example 2, the surface of the SiC substrate was rough.

According to Examples 1 and 2 as well as Comparative Examples 1 and 2, it is preferable that the temperature of the SiC substrate is set to 800° C. or higher and 1200° C. or lower. However, the heating temperature is not limited to this.

According to Examples 2 and 3, it can be understood that the nanofacets can be formed even if the off angle of the SiC substrate is changed. The off angle of the SiC substrate may be 1° or larger and 8° or smaller. The off angle of the SiC substrate may be 4° or larger and 8° or smaller. The off angle of the SiC substrate may be 4° or larger and 6° or smaller. However, the off angle is not limited to them.

According to Examples 2 and 4, it can be understood that the nanofacets can be formed even if the off direction of the SiC substrate is changed. The off direction of the SiC substrate may be [11-20] direction or [1-100] direction. However, the off direction is not limited to this.

According to Examples 2 and 5, it can be understood that the nanofacets can be formed even if the polymorph of the SiC substrate is changed. The polymorph of the SiC substrate may be 4H or 6H. However, the polymorph of the SiC substrate is not limited to this.

According to Examples 2 and 6, it can be understood that the nanofacets can be formed even if the crystal plane of the SiC substrate is changed. The crystal plane of the SiC substrate may be (0001) or (000-1). However, the crystal plane of the SiC substrate is not limited to this.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: processing chamber, 12: stage, 14: heating unit, 15: window portion, 16: shutter, 18: coupling hole, 20: gas supply cell, 22: tungsten filament, 30: hydrogen gas source,

40: silicon atom, 42: atomic hydrogen, 44: carbon atom, 100: processing device, 200: SiC substrate, 202: surface, 204: surface

What is claimed is:

1. A manufacturing method for manufacturing a SiC substrate having a flattened surface, comprising generating atomic hydrogen in a gas supply cell from raw material gas including hydrogen, the gas supply cell being coupled to a processing chamber in which the SiC substrate is placed; and etching a surface of the SiC substrate by irradiating the surface of the SiC substrate with the atomic hydrogen while the SiC substrate having an off angle is heated.

2. The manufacturing method according to claim 1, wherein in the etching, the SiC substrate is heated within a range of 800° C. or higher and 1200° C. or lower.

3. The manufacturing method according to claim 1, wherein the off angle of the SiC substrate is 1° or larger and 8° or smaller.

4. The manufacturing method according to claim 1, wherein an off direction of the SiC substrate is [11-20] direction.

5. The manufacturing method according to claim 1, wherein a polymorph of the SiC substrate is 4H or 6H.

6. The manufacturing method according to claim 1, wherein a crystal plane of the surface of the SiC substrate is (0001) or (000-1).

7. A manufacturing method for manufacturing a SiC substrate having a flattened surface, comprising generating atomic hydrogen from raw material gas including hydrogen by a heat from a tungsten filament or a plasma, and etching a surface of the SiC substrate by irradiating the surface of the SiC substrate with the generated atomic hydrogen.

8. The manufacturing method according to claim 1, wherein an off direction of the SiC substrate is [1-100] direction.

9. The manufacturing method according to claim 1, wherein the atomic hydrogen is generated by a heat from a tungsten filament or a plasma.

* * * * *